US011204556B2

(12) United States Patent
Huang et al.

(10) Patent No.: US 11,204,556 B2
(45) Date of Patent: *Dec. 21, 2021

(54) APPARATUS AND METHOD FOR MONITORING REFLECTIVITY OF THE COLLECTOR FOR EXTREME ULTRAVIOLET RADIATION SOURCE

(71) Applicant: TAIWAN SEMICONDUCTOR MANUFACTURING CO., LTD., Hsinchu (TW)

(72) Inventors: Yu-Chih Huang, Hsinchu (TW); Chi Yang, Tainan (TW); Che-Chang Hsu, Taichung (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/995,759

(22) Filed: Aug. 17, 2020

(65) Prior Publication Data

US 2020/0379357 A1 Dec. 3, 2020

Related U.S. Application Data

(63) Continuation of application No. 16/568,044, filed on Sep. 11, 2019, now Pat. No. 10,747,119.
(Continued)

(51) Int. Cl.
*G03F 7/20* (2006.01)
(52) U.S. Cl.
CPC .......... *G03F 7/70508* (2013.01); *G03F 7/702* (2013.01); *G03F 7/70091* (2013.01);
(Continued)

(58) Field of Classification Search
CPC ...... G03F 1/24; G03F 7/70058; G03F 7/2002; G03F 7/2004; G03F 7/70091;
(Continued)

(56) References Cited

U.S. PATENT DOCUMENTS 7,937,232 B1    5/2011   Chow et al.
8,796,666 B1    8/2014   Huang et al.
(Continued)

FOREIGN PATENT DOCUMENTS

TW          201351064 A      12/2013

OTHER PUBLICATIONS

Notice of Allowance issued in U.S. Appl. No. 16/568,044, dated Apr. 10, 2020.
(Continued)

*Primary Examiner* — Christina A Riddle
(74) *Attorney, Agent, or Firm* — McDermott Will & Emery LLP

(57) ABSTRACT

A method of controlling a feedback system with a data matching module of an extreme ultraviolet (EUV) radiation source is disclosed. The method includes obtaining a slit integrated energy (SLIE) sensor data and diffractive optical elements (DOE) data. The method performs a data match, by the data matching module, of a time difference of the SLIE sensor data and the DOE data to identify a mismatched set of the SLIE sensor data and the DOE data. The method also determines whether the time difference of the SLIE sensor data and the DOE data of the mismatched set is within an acceptable range. Based on the determination, the method automatically validates a configurable data of the mismatched set such that the SLIE sensor data of the mismatched set is valid for a reflectivity calculation.

20 Claims, 9 Drawing Sheets

Related U.S. Application Data

(60) Provisional application No. 62/738,893, filed on Sep. 28, 2018.

(52) U.S. Cl.
CPC ...... G03F 7/70158 (2013.01); G03F 7/70533 (2013.01); G03F 7/70541 (2013.01); G03F 7/70558 (2013.01); G03F 7/70591 (2013.01); G03F 7/7085 (2013.01)

(58) Field of Classification Search
CPC ............. G03F 7/70125; G03F 7/70133; G03F 7/70141; G03F 7/70158; G03F 7/702; G03F 7/70233; G03F 7/70258; G03F 7/70266; G03F 7/70308; G03F 7/70316; G03F 7/70325; G03F 7/70483; G03F 7/70491; G03F 7/705; G03F 7/70508; G03F 7/70516; G03F 7/70525; G03F 7/70533; G03F 7/70541; G03F 7/70558; G03F 7/70591; G03F 7/70616; G03F 7/70666; G03F 7/7085; G03F 7/70716; G03F 7/70908; G03F 7/7003; H05G 2/00–008
USPC ................ 355/30, 52–55, 67–71, 72–74, 77; 250/492.1, 492.2, 492.22, 492.23, 493.1, 250/503.1, 504 R, 505.1; 378/34, 35
See application file for complete search history.

(56) References Cited

U.S. PATENT DOCUMENTS

| | | | |
|---|---|---|---|
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |
| 10,747,119 | B2 * | 8/2020 | Huang ................ G03F 7/70033 |
| 2006/0167825 | A1 | 7/2006 | Sayal |
| 2010/0141925 | A1 | 6/2010 | Cao et al. |
| 2014/0358924 | A1 | 12/2014 | Seo et al. |
| 2018/0267523 | A1 | 9/2018 | Sigtermans et al. |
| 2019/0101838 | A1 | 4/2019 | Chen et al. |
| 2019/0339624 | A1 | 11/2019 | Yoshida et al. |

OTHER PUBLICATIONS

Notice of Allowance issued in corresponding U.S. Appl. No. 16/568,044, dated Apr. 10, 2020.

* cited by examiner

APPARATUS AND METHOD FOR MONITORING REFLECTIVITY OF THE COLLECTOR FOR EXTREME ULTRAVIOLET RADIATION SOURCE

CROSS REFERENCE TO RELATED APPLICATIONS

This application is a continuation of U.S. application Ser. No. 16/568,044 filed on Sep. 11, 2019, which claims the priority of U.S. Provisional Application No. 62/738,893 filed on Sep. 28, 2018, the entire content of which applications is incorporated herein by reference.

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser beam is focused on small tin droplet targets to form highly ionized plasma that emits EUV radiation with a peak maximum emission at 13.5 nm. The intensity of the EUV radiation produced by LPP depends on the effectiveness with which the high-powered laser can produce the plasma from the droplet targets. Synchronizing the pulses of the high-powered laser with generation and movement of the droplet targets can improve the efficiency of an LPP based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
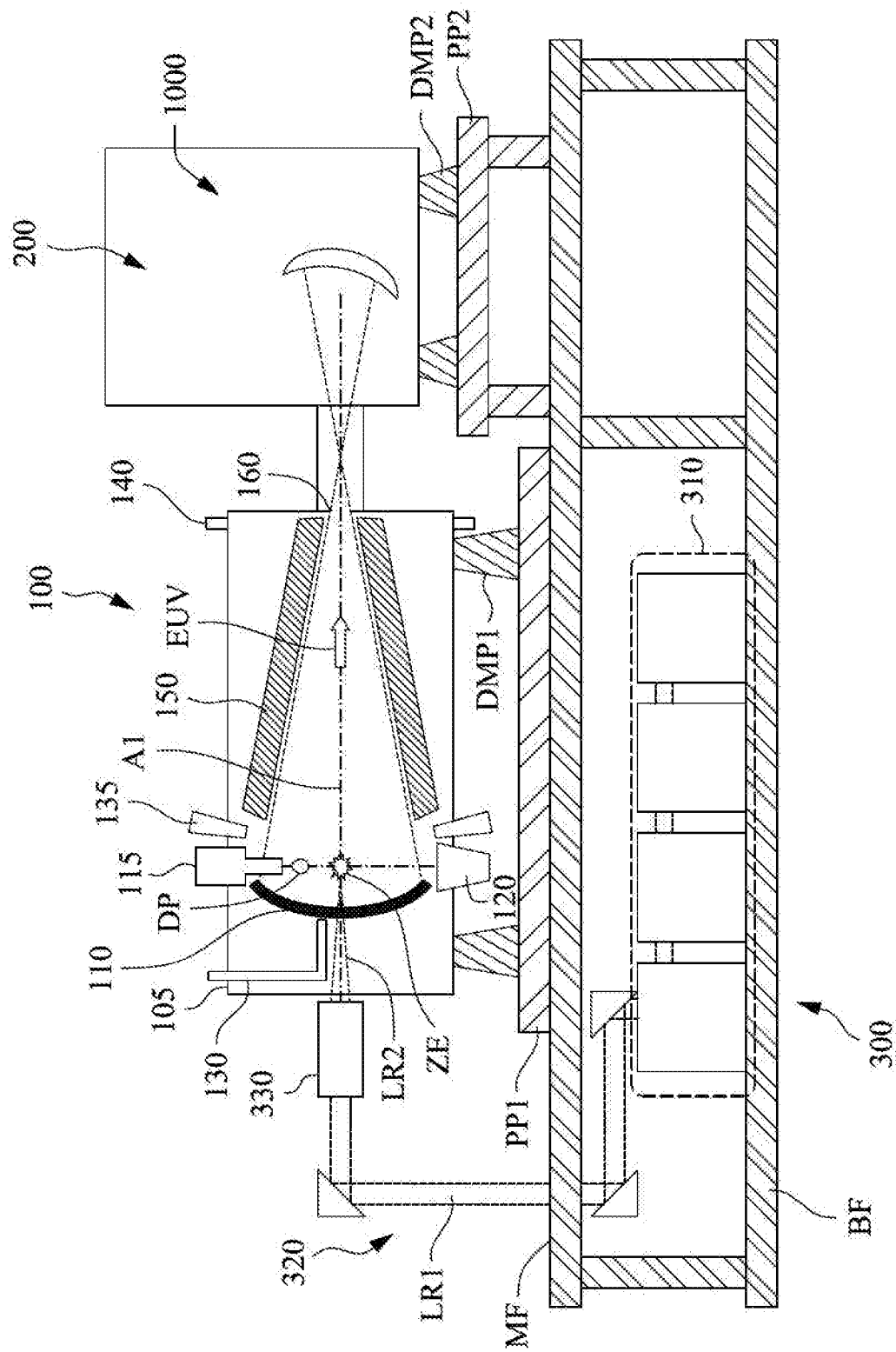
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatuses and methods for controlling an excitation laser used in a laser produced plasma (LPP) based EUV radiation source. The excitation laser heats metal (e.g., tin) target droplets in the LPP chamber to ionize the droplets to a plasma which emits EUV radiation. For optimum heating of the target droplets, the target droplets have to arrive at the focal point of the excitation laser at the same time as an excitation pulse from the excitation laser. Thus, synchronization between the target droplets and trigger time for triggering an excitation pulse from the excitation laser contributes to efficiency and stability of the LPP EUV radiation source. One of the objectives of the present disclosure is directed to controlling the excitation laser to provide optimum heating of target droplets.

FIG. 1 is a schematic view of an EUV lithography system with a laser production plasma (LPP) based EUV radiation source, constructed in accordance with some embodiments of the present disclosure. The EUV lithography system includes an EUV radiation source 100 to generate EUV radiation, an exposure tool 200, such as a seamier, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor MF. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a wafer stage, and wafer holding mechanism. The EUV radiation generated by the EUV radiation source 100 is guided by the reflective optical components onto a mask secured on the wafer stage. In some embodiments, the wafer stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The EUV radiation (EUV light) directed from the mask, carrying the image of the pattern defined on the mask, is collected by the reflective optical components, thereby forming an image on the resist. In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (µm) to about 100 µm. For example, in an embodiment, the target droplets DP are tin droplets, each having a diameter of about 10 µm, about 25 µm, about 50 µm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. A laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as "pre-pulse") is used to heat (or pre-heat) a given target droplet to create a low-density target plume with multiple smaller droplets, which is subsequently heated (or reheated) by a pulse from the main laser, generating increased emission of EUV.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplet DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector 110 further reflects and focuses the EUV radiation for the lithography exposing processes performed through the exposure tool 200.

The position of the zone of excitation ZE and parameters such as laser power, main pulse to pre-pulse delay, position of the pre-pulse focus, etc. are determined at the time the radiation source 100 is set up. The actual position of the zone of excitation ZE and parameters such as power and timing are then adjusted during wafer exposure using a feedback mechanism in various embodiments. However, these parameters change over time because of factors such as, for example, laser drift, instability in the droplet generator, and changes in chamber environment.

As has been discussed elsewhere herein, because the EUV radiation is ionizing radiation, the molten metal droplets are introduced in a vacuum chamber to prevent loss of EUV energy after generation. The plasma tends diffuse through the chamber and erode any materials nearby. The eroded materials as well as diffused plasma may coat the collector mirror, resulting in a loss of reflectivity, and ultimately the energy of EUV radiation being directed into the lithography tool. Thus, to maintain the energy levels of the EUV radiation that is output by the EUV source, the collector mirror may have to be replaced periodically. However, replacement of the collector mirror is not only expensive in itself, but also time intensive, and results in reduced throughput of the lithography tool. Apparatuses and methods are, therefore, desired to measure and monitor the reflectivity of the collector mirror to preemptively take action and reduce or eliminate degradation of the collector mirror.

Figure 2:
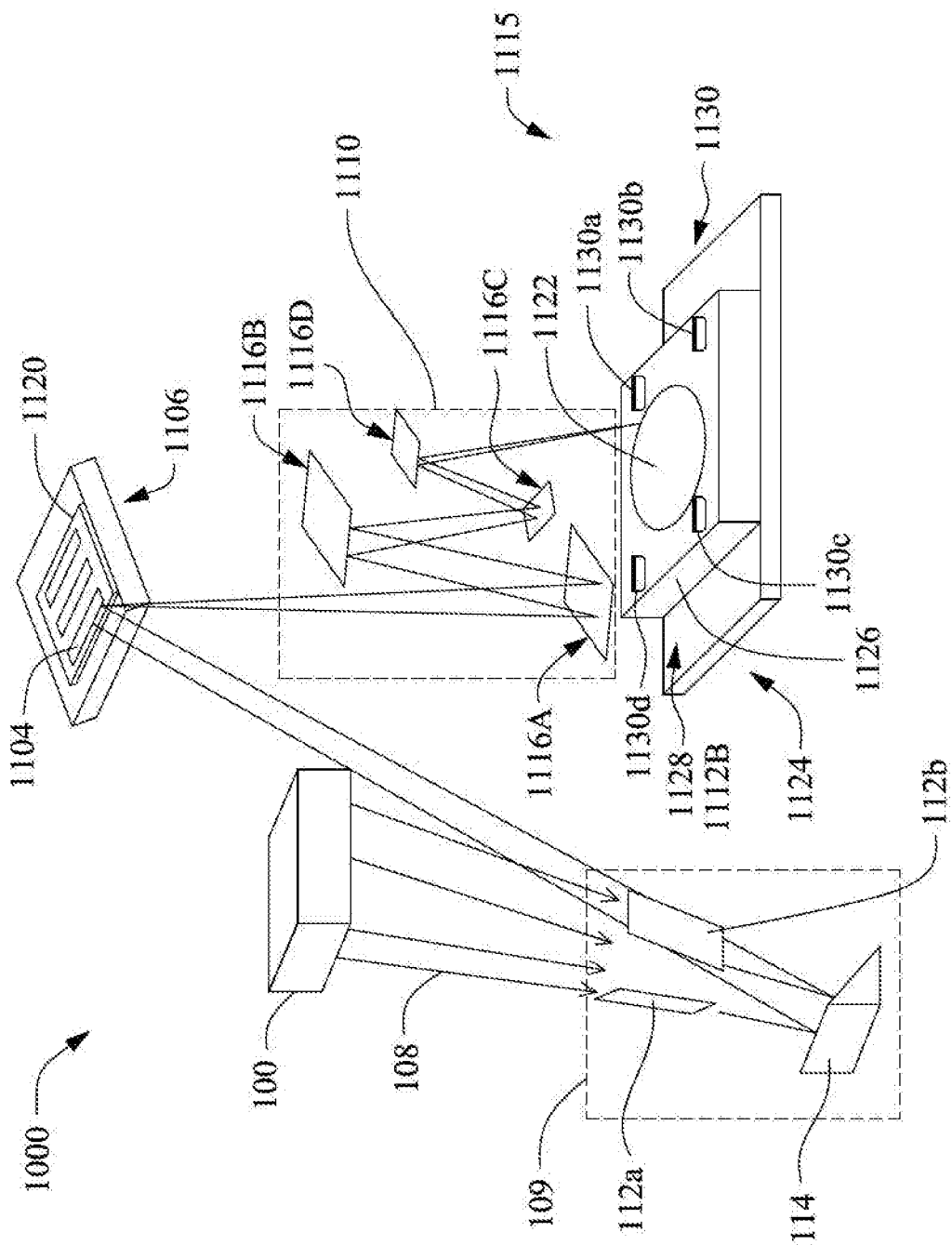
FIG. 2 is a schematic view of an extreme ultraviolet (EUV) illuminator with sensors on a wafer stage according to some embodiments.

FIG. 2 shows an example of an extreme ultraviolet (EUV) illuminator 1000 with a platform 1115 according to some embodiments. The radiation source 100 emits the EUV radiation 108 to a condenser 109. The condenser 109 includes surfaces 112a, 112b configured to focus the EUV radiation 108 and a reflector 114 configured to reflect the EUV radiation 108 towards a reticle 1104. The reticle 1104 may be secured to a mask stage 1106. The reticle 1104 has a pattern surface 1120 having a pattern to be transferred to a workpiece. The platform 1115 includes a wafer stage 1124 on which a wafer is to be placed, an electrostatic chuck 1126, and sensors 1130a, 1130b, 1130c, 1130d. A pattern surface 1120 of a reticle 1104 reflects the radiation towards diffractive optical elements (DOE) 1110. The diffractive optical elements (DOE) 1110 include a series of mirrors, such as mirrors 1116A, 1116B, 1116C, and 1116D. The mirrors 1116A-1116D reduce the size of the pattern carried by the EUV radiation. During operation, the DOE 1110 projects the EUV radiation carrying reticle pattern information towards the wafer 1122 disposed on the wafer stage 1124.

The wafer stage 1124 includes the electrostatic chuck 1126 configured to secure the wafer 1122 thereon. The electrostatic chuck 1126 is formed from a rigid material having a low coefficient of thermal conductivity. The electrostatic chuck 1126 may be connected to a number of actuators configured to the move the electrostatic chuck in various angles to focus the EUV radiation on the wafer 1122 and/or to align the pattern on the reticle 1104 with a target portion on the wafer 1122.

A number of sensors 1130a, 1130b, 1130c, 1130d (collectively sensors 1130) are disposed on a top of the wafer stage 1128 of the electrostatic chuck 1126. The sensors 1130 are selectively mounted on the electrostatic chuck 124 and are configured to evaluate and/or monitor imaging performance of the EUV illuminator 1000. The sensors 1130 include an upper plate that is transparent to radiation, such as radiation in the EUV wavelength, or include a pattern of transparent portions and opaque portions. The upper plate may be positioned to receive radiation from the EUV radiation. The received radiation may be directed to one or more transducers of the sensors 1130. The sensors 1130 include an optical element, such as a fiber optic plate or micro lens array, which is suitable to direct or focus the received radiation to the transducer. The transducer may be a device suitable to convert radiation to an electric signal, such as a photodiode, a CCD sensor, or a CMOS sensor. The output of the transducer is used to control, calibrate, and optimize the operation of the EUV illuminator 1000.

In some embodiments, the sensors 1130a, 1130b may be a transmission image sensor (TIS). The transmission image sensor (TIS) is used to measure a position of a projected aerial image of a mask pattern on the reticle 1104 at a wafer level. The projected aerial image at the wafer level may be a line pattern with a line having comparable wavelength to the wavelength of the radiation. The TIS sensors 1130a, 1130b are configured to measure the position of the mask with respect to the wafer stage 1124 in six degrees of freedom, e.g., three degrees of freedom in translation and three degrees of freedom in rotation. Additionally, magnification and scaling of the projected pattern may also be measured by the transmission image sensors 1130a, 1130b. The transmission image sensors 1130a, 1130b are capable of measuring pattern positions, influences of illumination settings, such as sigma, numerical aperture of lens. The transmission image sensors 1130a, 1130b are also used to align the reticle 1104 with the wafer 1122 and focus the EUV radiation to a target region on the wafer 1122. The transmission image sensors 1130a, 1130b are further configured to measure performance of the EUV illuminator 1000 and optical properties, such as pupil shape, coma, spherical aberration, astigmatism, and field curvature. Even though, two transmission image sensors 1130a, 1130b are shown in FIG. 2, any number of TIS sensors may be included according to the design of the EUV illuminator 1000.

In some embodiments, the sensor 1130c is an integrated lens interferometer at scanner (ILIAS) sensor. An ILIAS sensor is an interferometric wavefront measurement device that performs static measurement of the lens aberrations. The ILIAS sensor 1130c are also configured to measure wavefront errors in the EUV radiation.

In some embodiments, the sensor 1130d may be a spot sensor and/or a slit integrated energy (SLIE) sensor that are configured to measure a dose/intensity of the EUV radiation at the wafer level. The SLIE sensor is configured to provide a readout value from the photodiodes representing an energy integrated value. The measured intensity of the EUV radiation by the slit integrated energy (SLIE) sensor and/or the spot sensor at the wafer level is used to calculate the EUV radiation absorbed by the resist layer. The intensity of EUV radiation reduced in the path of the EUV radiation is one of the critical factors when compensating the effects of the EUV radiation loss, thereby improving the optical performance of the EUV illuminator 1000.

Figure 3:
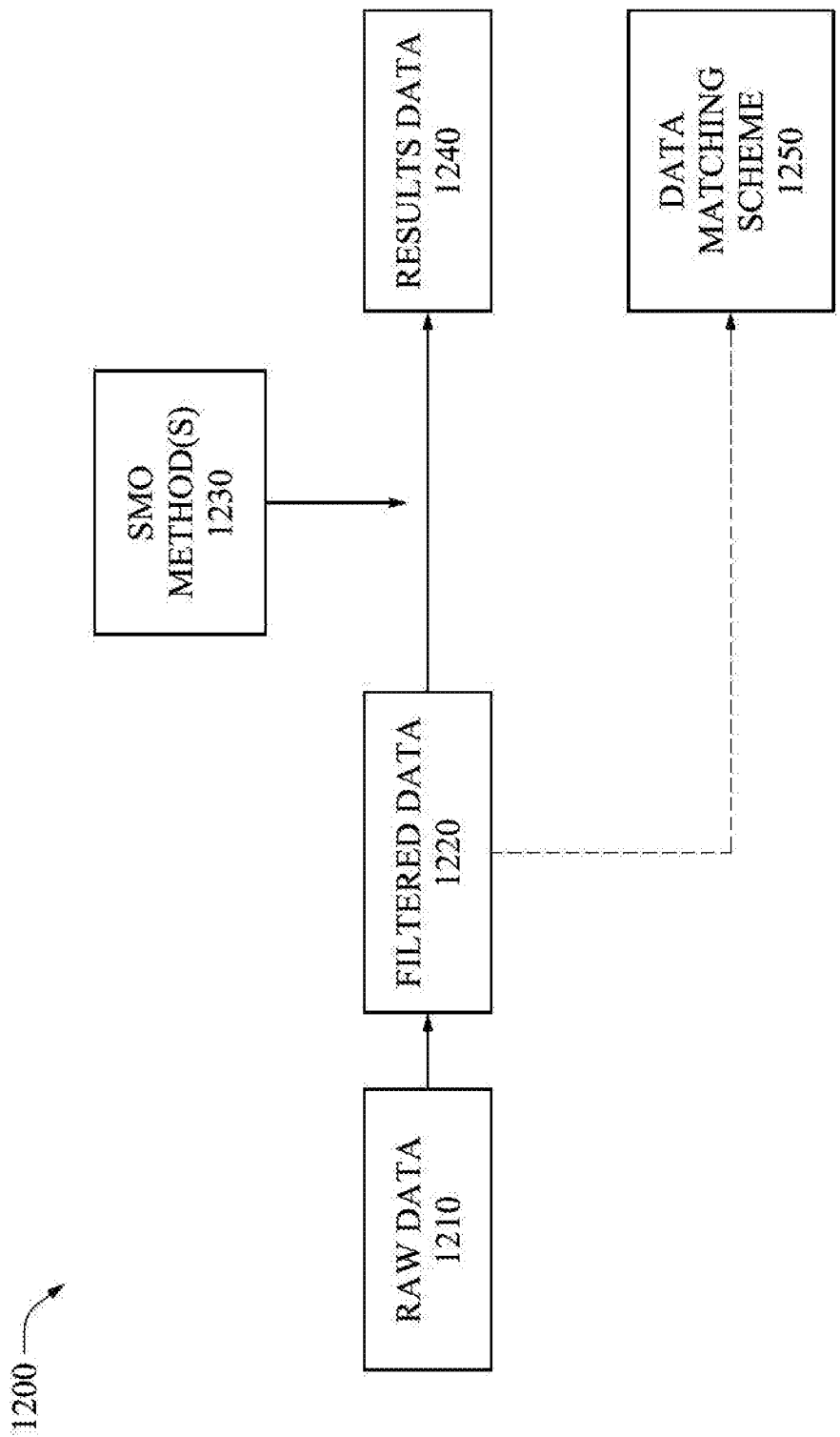
FIG. 3 is a schematic view of a general data process according to some embodiments.

FIG. 3 shows a schematic diagram of a data process 1200 for enhancing the optical performance of the EUV illuminator 1000. The data process 1200 utilizes raw data 1210 from the sensors 1130 such as, for example, one or more different sensors 1130a, 1130b, 1130c, 1130d of the EUV illuminator 1000 shown in FIG. 2 In some embodiments, the raw data 1210 includes at least one data selected from the group consisting of a transmission image sensor (TIS) data, an integrated lens interferometer at scanner (ILIAS) data, a spot sensor data and/or a slit integrated energy (SLIE) sensor data along with a time series measured. In some embodiments, the raw data 1210 are preprocessed to separate data of interest from noisy data in order to generate filtered data 1220. For example, the slit integrated energy (SLIE) sensor data can be separated from the noisy data to generate the filtered data 1220. The filtered data 1220 can be continually extracted, updated and managed in-line by various iterations and/or embodiments.

The diffractive optical elements (DOE) 1110 are part of source-mask optimization (SMO) configuration settings for the EUV light sources. The diffractive optical elements (DOE) 1110 include different light distribution settings such as, for example, parameters for the PFM (pupil facet mirror) to get an optimized depth of field (DOF) for a corresponding mask (reticle) pattern. In some embodiments, each of the diffractive optical elements (DOE) 1110 has a unique serial number assigned for the corresponding source-mask optimization (SMO) configuration settings.

The reflectivity of the collector is a very important key performance indicator for the EUV light source. In some embodiments as shown in FIG. 3, the reflectivity is calculated by using a source-mask optimization (SMO) methodologies 1230 that are applied to the filtered data 1220 to generate results data 1240. The results data 1240 are then communicated to a data matching module 1250 when calculating the reflectivity of the collector. In some embodiments, the filtered data 1220 is directly communicated to the data matching module 1250 to be used when calculating the reflectivity of the collector that represents the optical performance of the EUV illuminator 1000. In some embodiments, the source and mask optimization (SMO) methodologies 1230 are, for example, machine-learning methods that predict future behaviors and responses. In some embodiments, the source-mask optimization (SMO) methodologies 1230 are a combined method. The use of the combined data processing methods can provide a simple and effective solution at minimum complexity and expense for processing a sparse and small data set.

Figure 4:
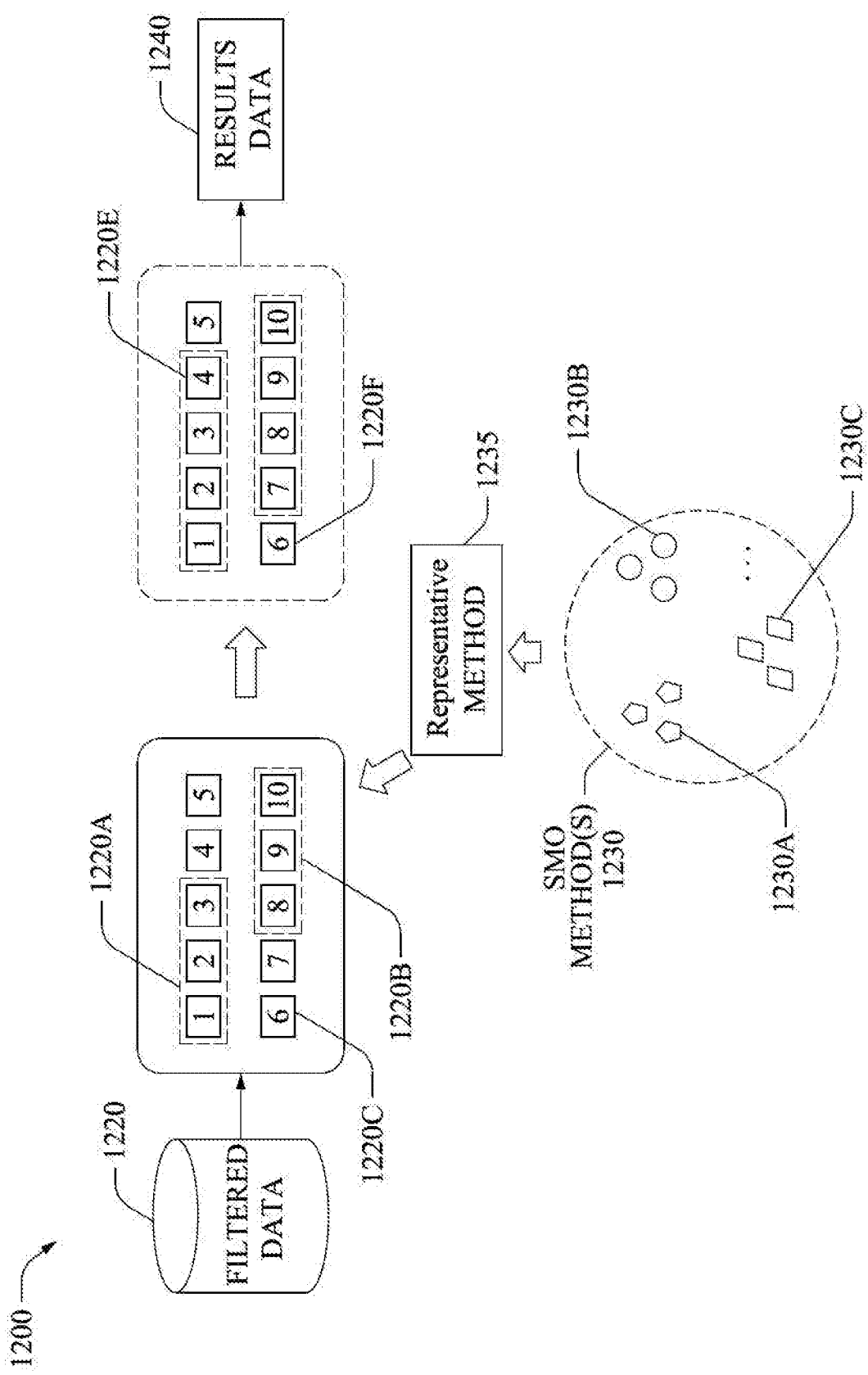
FIG. 4 schematically illustrates a data process in accordance with one or more embodiments of the present disclosure.

FIG. 4 illustrates the data processing in accordance with one or more embodiments of the present disclosure. When the reflectivity of the collector is calculated, a processor checks to see if the data associated with the diffractive optical elements (DOE) 1110 matches with the data associated with the slit integrated energy (SLIE) sensor data 1130d. When both the DOE and the SLIE report with the same time series data, the data set is classified as a data-matching identified data set. The filtered data 1220 can be classified into a plurality of data sets (e.g., data sets 1-10). In one exemplary embodiment shown in FIG. 4, the data sets 1-3 and 8-10 are classified as data-matching identified data sets 1220A and 1220B, respectively, and the data sets 4-7 are classified as a mismatched data set 1220C.

The source-mask optimization (SMO) methodologies 1230 are aggregated into a plurality of optimization methodologies such as, for example, 1230A, 1230B, and 1230C, to get a representative data processing methodology 1235. The plurality of optimization methodologies 1230A, 1230B, and 1230C can be selected from the group consisting of a timing gap tolerance method, a moving average (rolling average) method, a data sampling rate method, a data magnification factor method, a data smoothing filter method, types of sensor method. In some embodiments, the plurality of optimization methodologies 1230A, 1230B, and 1230C can be selectively adjusted. For example, in various different embodiments, new optimization methods can be added into the plurality of optimization methodologies 1230A, 1230B, and 1230C. In some embodiments, existing optimization methodologies can be removed from the plurality of optimization methodologies 1230A, 1230B, and 1230C. In some alternative embodiments, optimization methods can be adjusted to update the plurality of optimization methodologies 1230A, 1230B, and 1230C.

In response to the determination of the representative data processing method 1235, the representative method 1235 can be applied to the mismatched data set 1220C to identify one or more qualifying data sets 1220E such as, for example, data sets 4 and 7. In some alternative embodiments, the representative method 1235 can be applied to the mismatched data set 1220C to identify one or more disqualified data sets 1220F such as, for example, data sets 5 and 6.

In some embodiments, the representative data processing method 1235 is applied to the data-matching identified data set 1220A to generate a first target method. Then, the first target method can be applied to the mismatched data set 1220C to validate the performance of the first target method. Further, the aggregated methodologies 1230A, 1230B, and 1230C can be applied to the mismatched data set 1210C to generate a second target method, and the second target method can be applied to the testing data set 1210C to validate the performance at the second target method.

In some embodiments, technologies described and claimed herein can utilize machine learning systems that have been explicitly or implicitly trained to learn, determine or infer system needs, data matching requirements, interdependencies of the sensors 1130, and dynamically determine or infer data points of the sensors 1130 that achieve current and/or anticipated data matching requirements.

Figure 5:
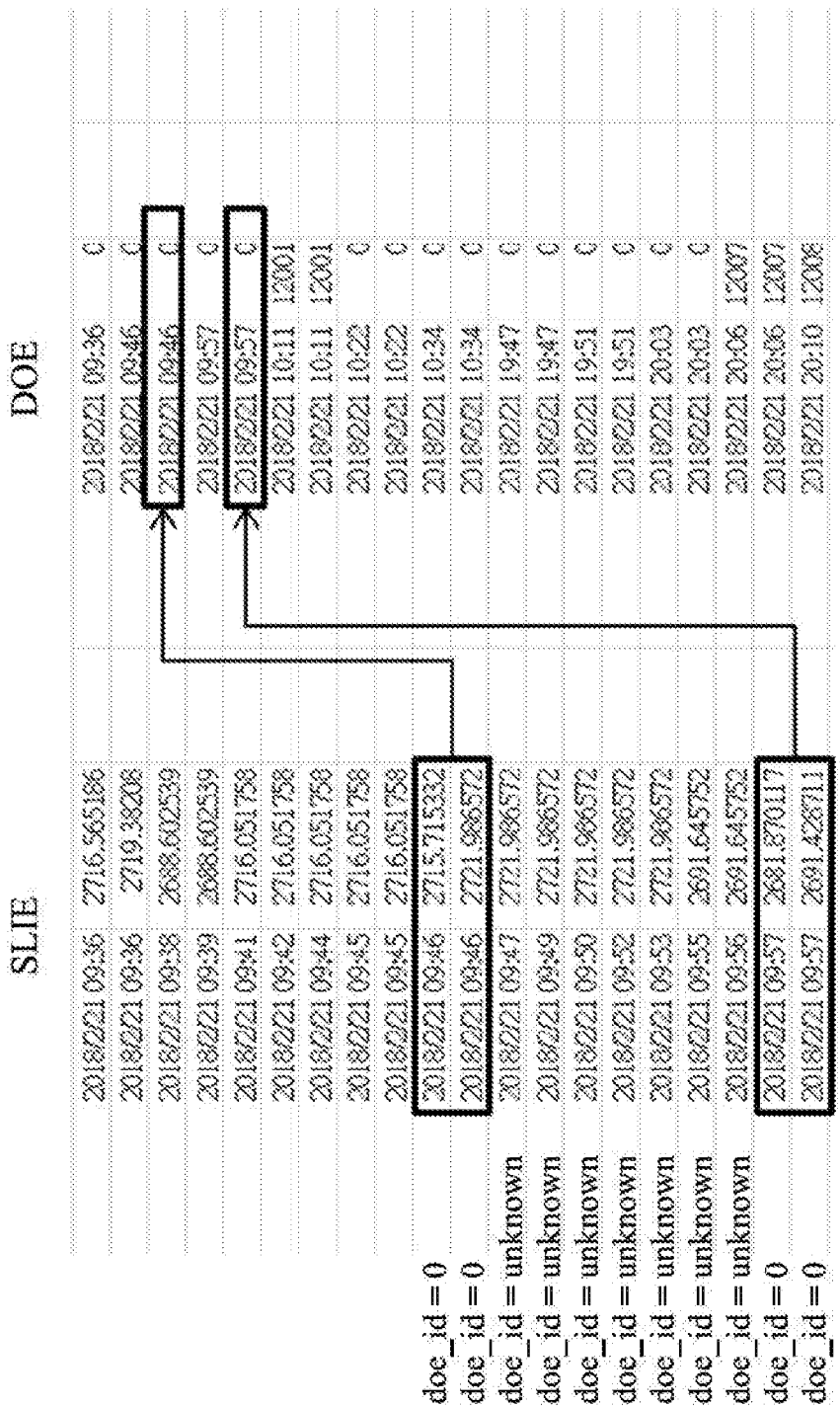
FIG. 5 illustrates mismatched time series for SLIE sensor data and DOE data.

The reflectivity of the collector is periodically monitored in an effort to preemptively prevent degradation of collector. When the reflectivity of the collector is calculated, the matching of a serial number of the source-mask optimization (SMO) configuration setting related with the diffractive optical elements (DOE) 1110 is checked and an exposure site EUV intensity is measured by the SLIE sensor 1130d. Both the DOE and the SLIE are reported as time series data by the exposure system of an EUV scanner. However, in some instances, the EUV scanner often outputs the DOE data and the SLIE sensor data with a time delay. For example, as can be seen in FIG. 5, in some instances, the periodic interval between the consecutive data points in the SLIE sensor data and the DOE data is different. In other words, the times at which the DOE data is collected and the times at which the SLIE sensor data is collected are different in some instances. This causes a loss of reflectivity data because the data points with mismatched times are omitted from the reflectivity calculation. For example, in FIG. 5, no reflectivity data was calculated between 9:47 and 9:56 because there is no DOE data available between these times.

In the exemplary data shown in FIG. 5, the loss of reflectivity data results in inaccurate or delayed monitoring, thereby causing a loss of capability to preemptively take action to prevent collector degradation. Accordingly, in some embodiments, the data matching module 1250 needs to adopt a mismatch-tolerant method such as, for example, a timing gap tolerance for the DOE data and SLIE sensor data. Using this data matching module 1250, the SLIE sensor data can be identified by the closest DOE data in time. In other words, a predetermined timing window can be applied when the data matching module 1250 identifies the SLIE sensor data as untimely or delayed DOE data, by assigning the SLIE sensor data with the closest DOE data in time.

Figure 6:
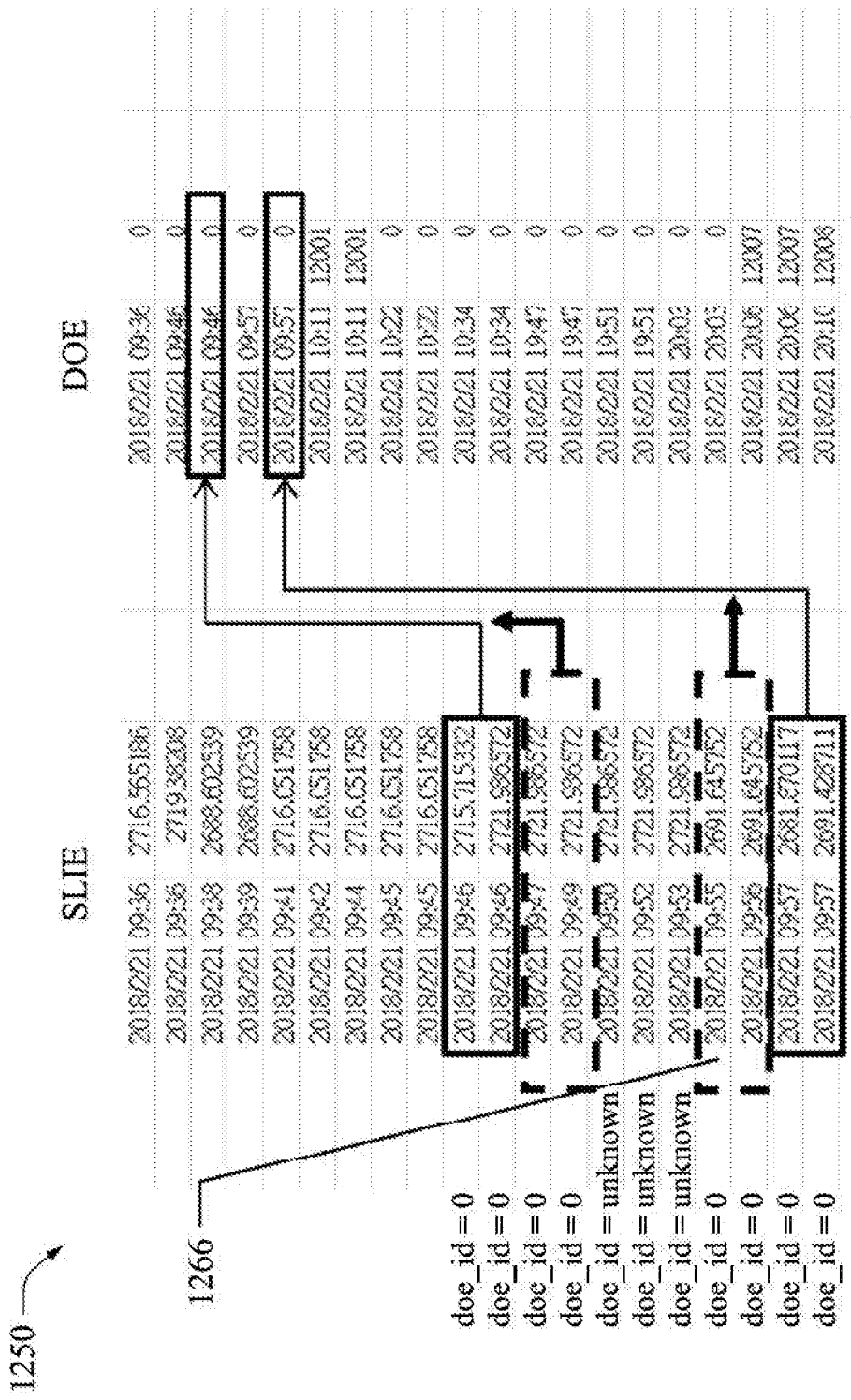
FIG. 6 illustrates examples of increasing data density in SLIE time series by providing a time gap tolerance in accordance with an embodiment of the present disclosure.

FIG. 6 shows an example of the enhanced data matching module 1250 that allows the use of the timing gap tolerance method with a 3 minute time gap. The data matching module 1250, in some embodiments, further includes a timing window calculation module 1260 that is configured to receive a timing window 1266 information. In some embodiments, the timing window 1266 is received from one or more software components, such as timing window preferences and/or one or more hardware components, such as, for example, the sensors 1130. Based on the timing window calculation module, the data matching module 1250 may review any combination of particular timing gap tolerance methods within a timing window 1266 such as, for example, 3 minutes. In the example, the SLIE sensor data at 9:47 is identified by the closest DOE data in time, e.g., reported during 9:44 to 9:50. The timing window 1266 can be 1 minute, 2 minutes, 4 minutes, or 5 minutes, or any other timing.

The enhanced data matching module 1250, in some embodiments shown in FIG. 6, provides a timing gap tolerance for DOE data and SLIE sensor data. The enhanced data matching module 1250 thereby reduces the instances of reflectivity data loss and further provide data integrity. In some embodiments, the reduction in data loss is observed about two times the density of the time series reflectivity data. The increase in the density of time series reflectivity data increases the precision of the degradation rate, allowing for a faster response to any potential degradation in collector reflectivity. For example, in some embodiments, the collector degradation rate was reduced from about −0.6% per giga pulse without using the timing gap tolerance to about −0.4% per giga pulse using the timing gap tolerance.

A feedback system/mechanism provided in some embodiments may further send a notification based on a based on a new data match information indicating whether the data match is within the acceptable data match range.

Figure 7:
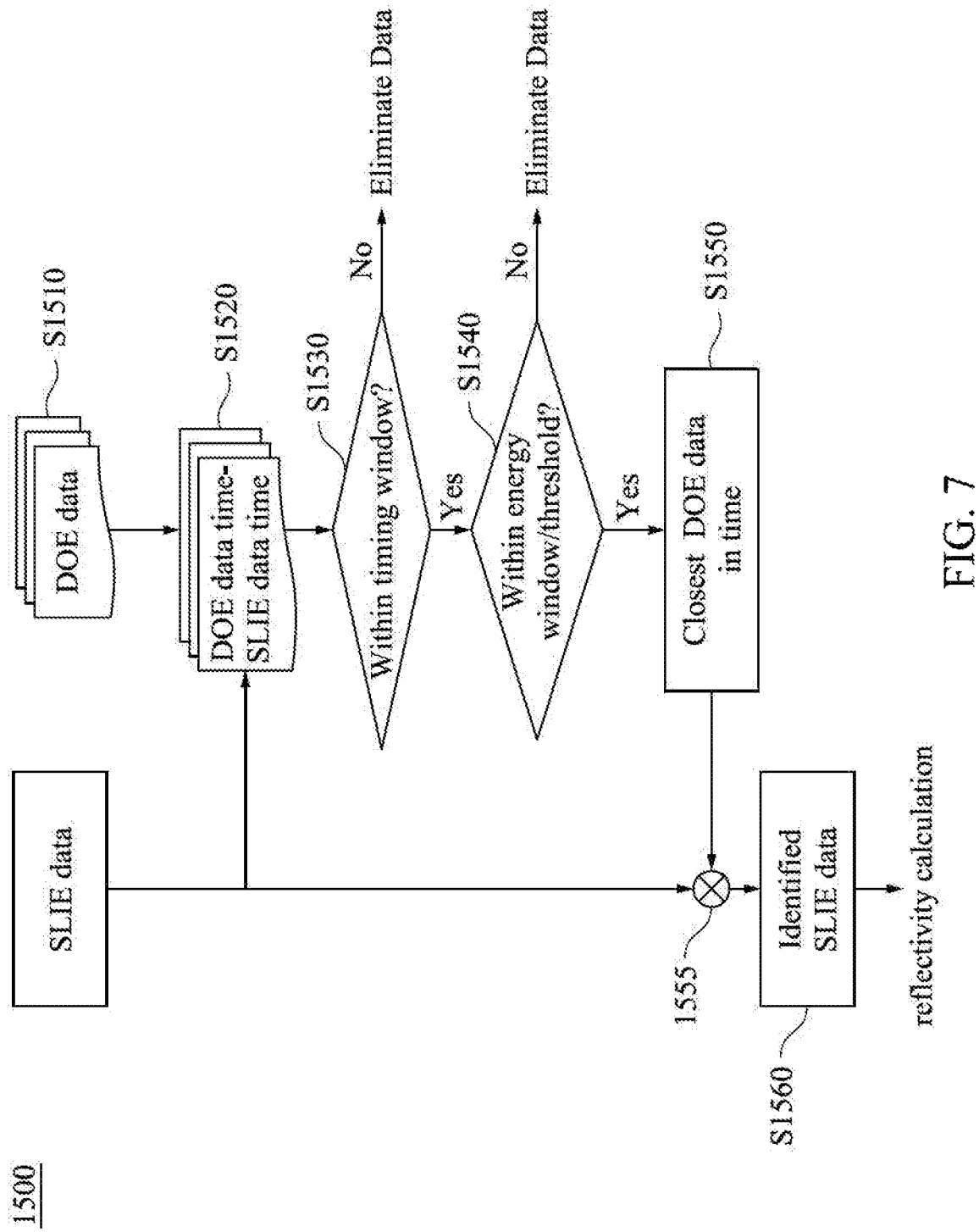
FIG. 7 illustrates a flow chart for the data extraction methodology in accordance with an embodiment of the present disclosure.

FIG. 7 illustrates a flow chart of a method 1500 for the data extraction methodology in accordance with an embodiment of the present disclosure. The method includes, at S1510, obtaining a slit integrated energy (SLIE) sensor data and diffractive optical elements (DOE) data. At S1520, the data matches are performed between SLIE sensor data and the corresponding DOE data where the time-stamp for the DOE data and the SLIE sensor data are used as an identifier. At S1530, the method includes determining whether a time difference between the time-stamp for the DOE data and the time-stamp for the SLIE sensor data is more than the timing window 1266. In some embodiments, if it is determined that the time difference is bigger than a predetermined timing window 1266 such as, for example 3 minutes, the data is eliminated. At S1540, the method includes determining whether an energy intensity by the SLIE sensor data is within an energy window/threshold 1268, and if it is determined to be outside of the energy window/threshold 1268, the data is eliminated. At S1550, the method includes the SLIE sensor data being identified with the closest DOE data. At S1560, the method includes the data being included as an identified SLIE data 1555 into a time series for the SLIE sensor data to perform the reflectivity calculation.

Figure 8:
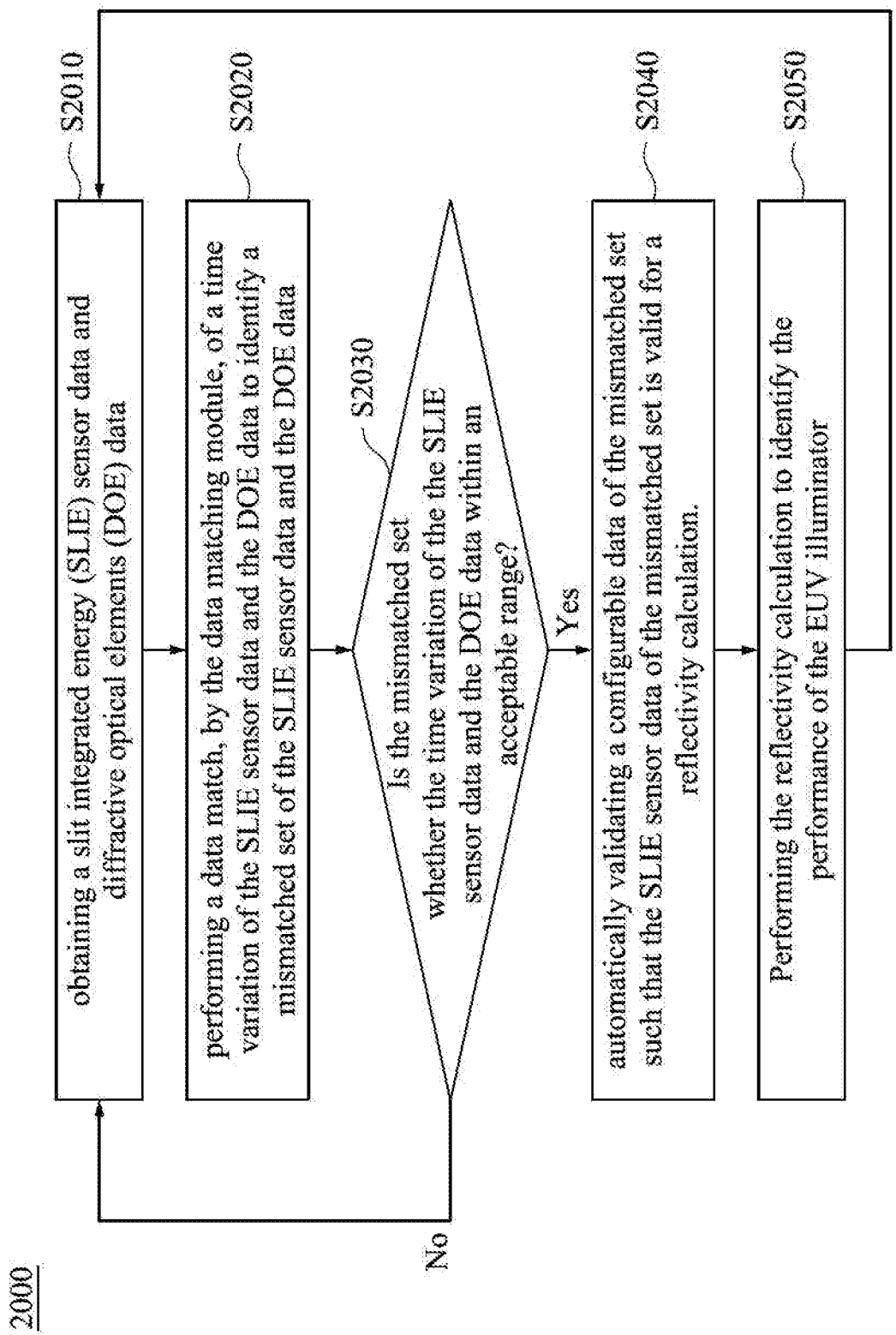
FIG. 8 illustrates a flow chart for the data extraction methodology in accordance with an alternative embodiment of the present disclosure.

FIG. 8 illustrates a flow chart of a method 2000 for the data extraction methodology in accordance with an alternative embodiment of the present disclosure. The method includes, at 52010, obtaining a slit integrated energy (SLIE) sensor data and diffractive optical elements (DOE) data. At S2020, the method includes performing a data match, by the data matching module, of a time difference of the SLIE sensor data and the DOE data. At S2030, the method includes determining whether a time difference of the data match is within an acceptable range. At S2040, the method also includes automatically replacing a configurable data of the diffractive optical elements (DOE) data with the closest DOE data to validate for a reflectivity calculation. At S2050, the method includes performing the reflectivity calculation to identify the performance of the EUV illuminator. In some embodiments, the acceptable range includes a timing window and/or a predetermined time threshold.

Figure 9A:
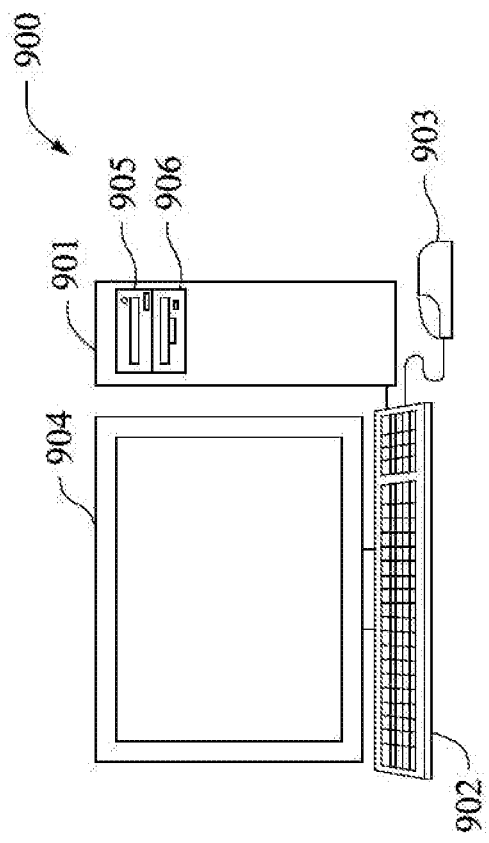
FIGS. 9A and 9B show a EUV data analyzing apparatus according to an embodiment of the present disclosure.
Figure 9B:
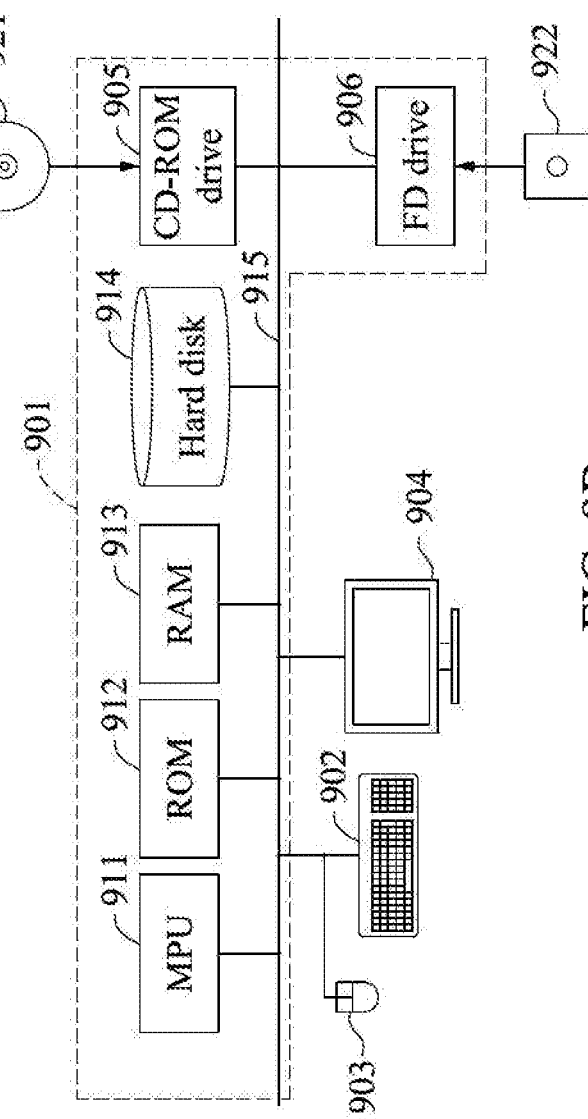

FIGS. 9A and 9B show a EUV data analyzing apparatus according to an embodiment of the present disclosure. FIG. 9A is a schematic view of a computer system that executes the in-line source-mask optimization process described above. The foregoing embodiments may be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a local area network (LAN).

The program for causing the computer system 900 to execute the functions of the EUV data analyzing apparatus in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the EUV data analyzing apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Further, the entirety of or a part of the programs to realize the functions of the in-line source-mask optimization apparatus is a part of another program used for EUV source-mask optimization processes in some embodiments. In addition, the entirety of or a part of the programs to realize the functions of the in-line source-mask optimization apparatus is realized by a ROM made of, for example, a semiconductor device in some embodiments.

Methods and apparatuses according to embodiments of the present disclosure improve extreme ultraviolet lithography efficiency and yield. Embodiments of the present disclosure monitor the reflectivity of the EUV radiation source collector and alert an operator when the collector should be cleaned and replaced. Monitoring of the collector's reflectivity can allow the collector to be cleaned or replaced before device yield is significantly negatively impacted. Proposed a better applicability data matching methodology then the conventional ones. The increased reflectivity data obtained by embodiments of the present disclosure results in up 2 times the data precision of the degradation rate of the collector. In some embodiments, the collector degradation rate defense was enhanced about 0.2% per giga-pulse with no lost data.

An embodiment of the disclosure is a method of calculating reflectivity of a collector for an extreme ultraviolet (EUV) radiation source. The method includes obtaining time series data for a first sensor and a second sensor. Then, each of data points in the time series data for the first sensor is identified for which a time stamp matches with a time stamp for a data point in the time series data for the second sensor, with a corresponding data point in the time series data of the second sensor. In response to a mismatch between the time stamps, data points in the time series data for the first sensor with data points in the time series data for the second sensor are identified for which a smallest difference in time stamps of data points in the time series data for the first sensor and time stamps of data points in the time series data for the second sensor is less than a predetermined value. Subsequently, a reflectivity of the collector is calculated using the identified data points in the time series data for the first sensor. In some embodiments, data from a slit integrated energy (SLIE) sensor is obtained. In some embodiments, data from diffractive optical elements (DOE) data is obtained along with a source-mask optimization serial number. In some embodiments, data points in the time series data for the SLIE sensor for which an energy data is less than a threshold value and data points in the time series data for the SLIE sensor for which a smallest difference in time stamps of data points in the time series data for the SLIE sensor and time stamps of data points in the time series data for the DOE is greater than a predetermined value are eliminated. In some embodiments, the predetermined value is in a range of 2 minutes to 4 minutes.

Another embodiment of the disclosure is a method of controlling a feedback system with a data matching module of an extreme ultraviolet (EUV) radiation source. The method includes obtaining a slit integrated energy (SLIE) sensor data and diffractive optical elements (DOE) data. Then, the data matching module performs a data match of a time difference of the SLIE sensor data and the DOE data to identify a mismatched set of the SLIE sensor data and the DOE data. The method then determines whether the time difference of the SLIE sensor data and the DOE data of the mismatched set is within an acceptable range. In response to the time difference of the SLIE sensor data and the DOE data that is not within the acceptable range of time difference of the data match, the method automatically validates a configurable data of the mismatched set such that the SLIE sensor data of the mismatched set is valid for a reflectivity calculation. In some embodiments, a unique serial number of the DOE data assigned for a corresponding source-mask optimization (SMO) configuration settings is identified. In some embodiments, a data match is performed identifying a time stamp for the SLIE sensor data and a time stamp for the DOE data that are identical. In some embodiments, the method identifies a time stamp for the SLIE sensor data and a time stamp for the DOE data that are within an allowable time window. In some embodiments, the method identifies whether the time difference is within a timing window. In some embodiments, the method also identifies whether the time difference is above a predetermined time threshold. In some embodiments, the acceptable range is determined using an optimization methodology selected from the group consisting of a timing gap tolerance method, a moving average (rolling average) method, a data sampling rate method, a data magnification factor method, a data smoothing filter method, and types of sensor method. In some embodiments, the SLIE sensor data is assigned with the closest DOE data in time. In some embodiments, the feedback system generates a notification based on a new data match information indicating when the data match is within the acceptable data match range.

An embodiment of the disclosure is an apparatus for generating extreme ultraviolet (EUV) radiation. The apparatus includes a transmission image sensor (TIS) platform, data matching module, and a controller coupled to the data matching module. The TIS platform includes a wafer stage on which a wafer is to be placed, an electrostatic chuck, and sensors. The data matching module is configured to obtain a slit integrated energy (SLIE) sensor data and diffractive optical elements (DOE) data. The controller is programmed to perform a data match of a time difference of the SLIE sensor data and the DOE data by the data matching module to identify a mismatched set of the SLIE sensor data and the DOE data. Then, the controller is programmed to determine whether a time difference of the SLIE sensor data and the DOE data of the mismatched set is within an acceptable range. In response to the time difference of the SLIE sensor data and the DOE data that is not within the acceptable range of time difference of the data match, the controller is programmed to automatically validate a configurable data of the mismatched set such that the SLIE sensor data of the mismatched set is valid for a reflectivity calculation. In some embodiments, the data matching module includes a timing window calculation module that is configured to receive a timing window from one or more software components and one or more hardware components. In some embodiments, the timing window calculation module is configured to receive a timing window from the sensors. In some embodiments, the acceptable range includes the time difference that is within a timing window. In some embodiments, the timing window is in a range of about 2 minutes to about 4 minutes. In some embodiments, the acceptable range includes the time difference is above a predetermined time threshold.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of calculating reflectivity of a collector for an extreme ultraviolet (EUV) radiation source, the method comprising
obtaining data of a first sensor and a second sensor to compare time stamps of the first sensor and the second sensor;
determining whether a time difference between the time stamps of the first sensor and the second sensor is within an acceptable range;
in response to a determination that the time difference is within the acceptable range, automatically adjusting a configurable data such that first sensor data is valid for calculating the reflectivity; and
calculating the reflectivity of the collector using the configurable data.

2. The method of claim 1, wherein obtaining time series data includes obtaining data from a slit integrated energy (SLIE) sensor.

3. The method of claim 2, wherein obtaining time series data includes obtaining data from diffractive optical elements (DOE) data along with a source-mask optimization serial number.

4. The method of claim 2, further comprising eliminating data points in the time series data for the SUE sensor for which an energy data is less than a threshold value and data points in the time series data for the SUE sensor for which a smallest difference in time stamps of data points in the time series data for the SLIP sensor and time stamps of data points in the time series data for the DOE is greater than a predetermined value.

5. The method of claim 1, wherein the time difference is in a range of 2 minutes to 4 minutes.

6. A method of analyzing reflectivity of a collector for an extreme ultraviolet (EUV) radiation source, the method comprising:
obtaining a slit integrated energy (SUE) sensor data and diffractive optical elements (DOE) data and comparing time stamps;
determining whether a time difference of the SLIE sensor data and the DOE': data is within an acceptable range;
in response to a determination that the time difference is within the acceptable range, automatically validating the SLIE sensor data for calculating the reflectivity; and
analyzing the reflectivity data of the collector based on the time difference of the SLIE sensor data and the DOE data.

7. The method according to claim 6, wherein obtaining a slit integrated energy (SLIE) sensor data and diffractive optical elements (DOE) data includes identifying a unique serial number of the DOE data assigned for a corresponding source-mask optimization (SMO) configuration settings.

8. The method according to claim 6, wherein performing a data match includes identifying a time stamp for the SLIE sensor data and a time stamp for the DOE data that are identical.

9. The method according to claim 6, wherein performing a data match includes identifying a time stamp for the SLIE sensor data and a time stamp for the DOE data that are within an allowable time window.

10. The method according to claim 6, wherein determining whether the time difference is within an acceptable range includes identifying whether the time difference is within a timing window.

11. The method according to claim 6, wherein determining the time difference is within an acceptable range includes identifying whether the time difference is above a predetermined time threshold.

12. The method according to claim 6, wherein the acceptable range is determined using an optimization methodology selected from the group consisting of a timing gap tolerance method, a moving average (rolling average) method, a data sampling rate method, a data magnification factor method, a data smoothing filter method, and types of sensor method.

13. The method according to claim 6, wherein automatically validating the SLIE sensor data includes assigning the SUE sensor data with the closest DOE data in time.

14. The method according to claim 6, further comprising generating, by a feedback system, a notification based on a new data match information indicating when the data match is within the acceptable data match range.

15. A system of analyzing a performance data of a collector for an extreme ultraviolet (EUV) radiation source, the system comprising:
a transmission image sensor (TIS) platform including a wafer stage on which a wafer is to be placed, an electrostatic chuck, and sensors;
a memory that stores computer executable components;
a processor that executes computer executable components stored in the memory, wherein the computer executable components comprise:
a data matching executable instruction module configured to obtain a slit integrated energy (SUE) sensor data and diffractive optical elements (DOE) data, and programmed to:
perform a data match, by the data matching executable instruction module, of a time difference of the SLIE sensor data and the DOE data to identify a mismatched set of the SLIE sensor data and the DOE data,
determine whether a time difference of the SLIE sensor data and the DOE data of the mismatched set is within an acceptable range, and
in response to the time difference of the SLIE sensor data and the DOE data that is not within the acceptable range of time difference of the data match, automatically validating a configurable data of the mismatched set such that the SUE sensor data of the mismatched set is valid for analysis of the performance data.

16. The system of claim 15, wherein the data matching executable instruction module includes a timing window calculation module that is configured to receive a timing window from one or more software components and one or more hardware components.

17. The system of claim 16, wherein the timing window calculation module is configured to receive a timing window from the sensors.

18. The system of claim 15, wherein acceptable range includes the time difference that is within a timing window.

19. The system of claim 18, wherein e timing window is in a range of about 2 minutes to about 4 minutes.

20. The system of claim 15, wherein the acceptable range includes the time difference is above a predetermined time threshold.

* * * * *